(12) United States Patent
Tochimoto et al.

(10) Patent No.: US 8,297,149 B2
(45) Date of Patent: Oct. 30, 2012

(54) FRICTION DRIVE ACTUATOR

(75) Inventors: Shigeaki Tochimoto, Ibaraki (JP); Akihiro Oki, Izumi (JP); Takashi Matsuo, Itami (JP)

(73) Assignee: Konica Minolta Opto, Inc., Tokyo (JP)

( * ) Notice: Subject to any disclaimer, the term of this patent is extended or adjusted under 35 U.S.C. 154(b) by 1287 days.

(21) Appl. No.: 12/035,719

(22) Filed: Feb. 22, 2008

(65) Prior Publication Data
US 2008/0207390 A1 Aug. 28, 2008

(30) Foreign Application Priority Data

Feb. 28, 2007 (JP) ................................. 2007-048787
Jan. 15, 2008 (JP) ................................. 2008-005502

(51) Int. Cl.
*F16F 15/22* (2006.01)
*G05G 1/00* (2006.01)
*G05G 3/00* (2006.01)
*H01L 41/00* (2006.01)
*H02N 2/00* (2006.01)

(52) U.S. Cl. .............. 74/570.3; 310/323.02; 310/323.16; 310/323.14; 271/267; 74/574.4

(58) Field of Classification Search ............. 310/323.14, 310/323.16, 328, 323.02; 271/267; 74/570.3, 74/574.4; H01L 41/09; H02N 2/12
See application file for complete search history.

(56) References Cited

U.S. PATENT DOCUMENTS

| | | | |
|---|---|---|---|
| 4,613,782 A * | 9/1986 | Mori et al. | 310/323.16 |
| 4,997,177 A * | 3/1991 | Mori et al. | 271/267 |
| 5,132,582 A * | 7/1992 | Hayashi et al. | 310/323.16 |
| 5,191,688 A * | 3/1993 | Takizawa et al. | 29/25.35 |
| 6,218,769 B1 * | 4/2001 | Iino et al. | 310/328 |
| 6,373,170 B1 * | 4/2002 | Hills | 310/328 |
| 6,707,232 B2 * | 3/2004 | Iino et al. | 310/323.02 |
| 7,923,899 B2 * | 4/2011 | Adachi | 310/323.14 |
| 2003/0201695 A1 | 10/2003 | Funakubo | |
| 2004/0027032 A1 | 2/2004 | Moteki | |

(Continued)

FOREIGN PATENT DOCUMENTS
EP 0978887 A2 * 2/2000

(Continued)

OTHER PUBLICATIONS

English language translation of Office Action (dated May 31, 2012) in corresponding Japanese application No. 2008-005502.

*Primary Examiner* — Vinh T. Luong
(74) *Attorney, Agent, or Firm* — Cozen O'Connor

(57) ABSTRACT

A friction drive actuator, comprising: a vibration member which is configured to be driven to vibrate by expansion and contraction of a piezoelectric displacement portion which is included in the vibration member and driven by a driving signal; a sliding member which is in contact with the vibration member and is driven by the vibration member in a first direction with respect to the vibration member; a pressing member which causes the vibration member and the sliding member to come into a pressure contact therebetween; and a control member which is provided on each of the vibration member and the sliding member at a contact portion therebetween for controlling a relative movement of the sliding member with respect to the vibration member in a direction perpendicular to the first direction when the vibration member and the sliding member are pressedly contacted with each other by the pressing member.

9 Claims, 10 Drawing Sheets

U.S. PATENT DOCUMENTS

2006/0043824 A1 3/2006 Sakano
2006/0250048 A1 11/2006 Moteki

FOREIGN PATENT DOCUMENTS

| | | | |
|---|---|---|---|
| EP | 1122878 A2 * | 8/2001 | |
| JP | 6-78570 A | 3/1994 | |
| JP | 2000-224876 A | 8/2000 | |
| JP | 2001-222869 A | 8/2001 | |
| JP | 2004-104984 | 4/2004 | |
| JP | 2004-166478 | 6/2004 | |
| JP | 2005-57838 A | 3/2005 | |
| JP | 2006-067712 | 3/2006 | |

* cited by examiner

FRICTION DRIVE ACTUATOR

This application claims priority on Japanese Patent Application No. 2007-048787 filed on Feb. 28, 2007, and on Japanese Patent Application No. 2008-005502 filed on Jan. 15, 2008, both in the Japanese Patent Office, the entire contents of which applications are hereby incorporated by reference.

TECHNICAL FIELD

The present invention relates to a friction drive actuator and more particularly to a friction drive actuator for causing a vibration member to make pressure contact with a sliding member to generate a relative movement.

BACKGROUND

Conventionally, use of a friction drive actuator for various moving devices has been tried. The friction drive actuator is generally comprised of a vibration member having a piezoelectric element which is an electromechanical energy conversion element and a sliding member for making contact with the vibration member in a pressurized state. The friction drive actuator is an actuator in which a relative movement between the vibration member and the sliding member in pressure contact with the vibration member is caused by an elliptical vibration (herein after, including a circular vibration) of a part of the vibration member, the elliptical vibration which is generated by inputting a drive signal into the piezoelectric element to expand and contract it.

The friction drive actuator is compact and excellent in silence, so that it is used as a drive mechanism for an electronic device such as an electronic camera, and in recent years, its applications have been spread more, and use thereof in a drive mechanism of a recording/reproducing head of an information recording apparatus such as a HDD and a DVD has been variously examined.

For example, there is known a vibration wave linear motor (a friction drive actuator) in which a vibration member is pressurized and held between two cylindrical guide shafts (sliding members), and due to an elliptical vibration generated in the drive contact portion of the vibration member, the vibration member and guide shafts make a relative movement in the axial direction (for example, refer to Unexamined Japanese Patent Application Publication No. 2005-57838).

Here, the schematic constitution of the vibration wave linear motor disclosed in Unexamined Japanese Patent Application Publication No. 2005-57838 will be explained by referring to FIGS. 10a, 10b. FIG. 10a is a front sectional view of a vibration wave linear motor 46, and FIG. 10b is a cross sectional view along the line D-D' in FIG. 10a.

On each of the upper and lower surfaces of a vibrator body 75, provided is a connection type drive contact portion 93 in which a flat portion 92 and a drive contact portion 76 are unified with each other. Two upper and lower guide shafts 77 (77-1, 77-2) in contact with recessed portions 76a of the connection type drive contact portions 93 are supported by upright members 78-2 of support members 78. The lower guide shaft 77-2 is pressed upwardly by a spiral spring 83, thus a vibrator 70 is pressurized and held between the two guide shafts 77. When AC voltages different in phase are applied to the vibrator body 75, the vibrator body 75 generates a vibration wave, and an elliptical rotation vibration is generated in the drive contact portions 76. By the elliptical rotation vibration, the vibrator 70 moves relatively to the two guide shafts 77 and support members 78 in the axial direction. By use of such a constitution, one part thereof is fixed, and the other part is connected to a driven member, thus the driven member can be driven to move.

Further, there is known a fine drive device (a friction drive actuator) for swinging a head arm (a sliding member) having a recording/reproducing head around a rotary shaft inserted through a rotation hole formed in the head arm, the drive device which is driven by an elliptical vibration generated in a vibration member in pressure contact with the head arm (for example, refer to Unexamined Japanese Patent Application Publication No. 2000-224876).

Further, there is known a rotary type ultrasonic actuator (a friction drive actuator) for rotating a rotor (a sliding member) born by ball bearings by a vibration member (for example, refer to Unexamined Japanese Patent Application Publication No. H06-78570).

Further, there is known an information recording/reproducing head drive device (a friction drive actuator) for swinging a head arm (a sliding member) around a V-shaped fulcrum formed in the head arm and supported by a wedge type support member by an elliptical vibration generated in a vibration member in pressure contact with the head arm (for example, refer to Unexamined Japanese Patent Application Publication No. 2001-222869).

On the other hand, in the information recording apparatus such as a HDD and a DVD, with the progress of higher recording density, the head drive mechanism is required to realize highly precise positioning of the head to the target position of a recording medium in submicron. Further, in correspondence with miniaturization and lower price of the information recording apparatus, further miniaturization and lower price are required for the drive mechanism.

In the vibration wave linear motor disclosed in Unexamined Japanese Patent Application Publication No. 2005-57838, as shown in FIG. 10b, the contact surfaces between the guide shafts 77 (77-1, 77-2) and the drive contact portions 76 are formed in a cylindrical shape with the same radius. However, when joining the two, unless the radii of the recessed portions 76a of the drive contact portions 76 are made larger than the radii of the guide shafts 77 (77-1, 77-2), and gaps are formed between the two, the two cannot be joined. Therefore, even if the two are processed highly precisely, gaps of microns are generated, and backlash is caused.

Further, the guide shaft 77-2 is supported by a bearing slotted hole 81 formed in the upright member 78-2 and is pressed up by the spiral spring 83. However, the support member is required to have a fitting backlash of microns, and an inclination of the vibrator 70 with respect to the guide shaft 77, which is equivalent to the fitting backlash, is generated and the relative position between the vibrator 70 and the guide shaft 77 fluctuates.

Therefore, in the vibration wave linear motor having such a constitution, due to various types of backlash of microns generated between the vibrator 70 and the guide shaft 77, it is difficult to set highly precisely the relative position between the two in microns which is required for the information recording apparatus.

Further, in the fine drive device disclosed in Unexamined Japanese Patent Application Publication No. 2000-224876, although the mechanism constitution is not described in detail, the head arm has a bearing mechanism of the rotary shaft, so that it can be inferred easily that backlash is caused in the bearing section. Further, the vibration member is structured so as to incline also in a direction other than the pressing direction, and for example, the head arm may rotate in a slightly twisted direction with respect to the rotary shaft. Therefore, there is a possibility that the head section provided at the end of the head arm may collide with the recording surface of the disk. Further, the constitution having no bearing mechanism is disclosed, though even in these constitutions, by the out-of-roundness and abrasion condition of the guide member and a shift of the shaft center due to a dent caused by an impact load, it may be considered that the positioning is affected greatly.

Further, in the rotary type ultrasonic actuator disclosed in Unexamined Japanese Patent Application Publication No. H06-78570, the members such as the ball bearings for bearing the rotor are used, so that backlash between the balls and the inner and outer walls cannot be avoided. The backlash component in the direction of the rotary shaft is biased, though the backlash component in the radial direction cannot be biased. These gaps are ones in microns and influence greatly the positioning. Further, at time of drive start of the vibration member, the gaps are first biased and then the drive in a desired direction is started, so that a problem arises that the startup characteristic is influenced. Further, when a highly rigid load support member is structured by such a mechanism, there is a possibility that complication and high price of the device due to enlargement of the apparatus and an increase in the mechanical parts may be caused.

Further, in the information recording/reproducing head drive apparatus disclosed in Unexamined Japanese Patent Application Publication No. 2001-222869, due to the pressure contact of the vibration member, the compression pressure to the V-shaped fulcrum by the wedge type support member is increased, thus there is a possibility that the fulcrum may be abraded. As a result, the position of the head mounted on the end of the arm is changed.

SUMMARY

In view of the forgoing problems, an object of the present invention is to provide a friction drive actuator for realizing highly precise positioning without causing complication and high price.

In view of forgoing, one embodiment according to one aspect of the present invention is a friction drive actuator, comprising:

a vibration member which is configured to be driven to vibrate by expansion and contraction of a piezoelectric displacement portion which is included in the vibration member and driven by a driving signal;

a sliding member which is in contact with the vibration member and is driven by the vibration member in a first direction with respect to the vibration member;

a pressing member which causes the vibration member and the sliding member to come into a pressure contact therebetween; and a control member which is provided on each of the vibration member and the sliding member at a contact portion therebetween for controlling a relative movement of the sliding member with respect to the vibration member in a direction perpendicular to the first direction and parallel to a surface of the sliding member when the vibration member and the sliding member are pressedly contacted with each other by the pressing member.

According to another aspect of the present invention, another embodiment is a friction drive actuator, comprising:

a vibration member which is configured to be driven to vibrate by expansion and contraction of a piezoelectric displacement portion which is included in the vibration member and driven by a driving signal;

a sliding member which is formed to be circular, disposed in pressure contact with the vibration member at an inner circumferential surface of the sliding member so as to be elastically deformed, and rotates in a first direction with respect to the vibration member when driven by the vibration member; and a control portion which is provided on each of the vibration member and the sliding member at a contact portion therebetween for controlling a relative movement of the sliding member with respect to the vibration member in a direction perpendicular to the first direction and parallel to a surface of the sliding member.

DETAILED DESCRIPTION OF THE PREFERRED EMBODIMENTS

Hereinafter, embodiments of the friction drive actuator relating to the present invention will be described with reference to the accompanying drawings. Further, although the present invention will be described on the basis of the embodiments drawn, the present invention is not limited there.

Embodiment 1

Figure 1A:
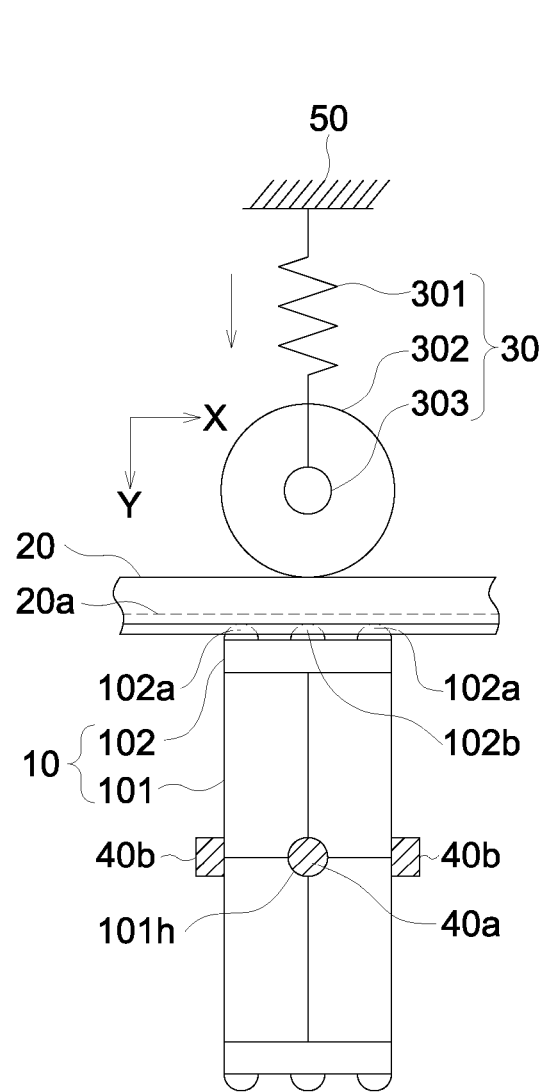
FIGS. 1a, 1b are entire schematic views of a friction drive actuator of Embodiment 1 of the present invention.
Figure 1B:
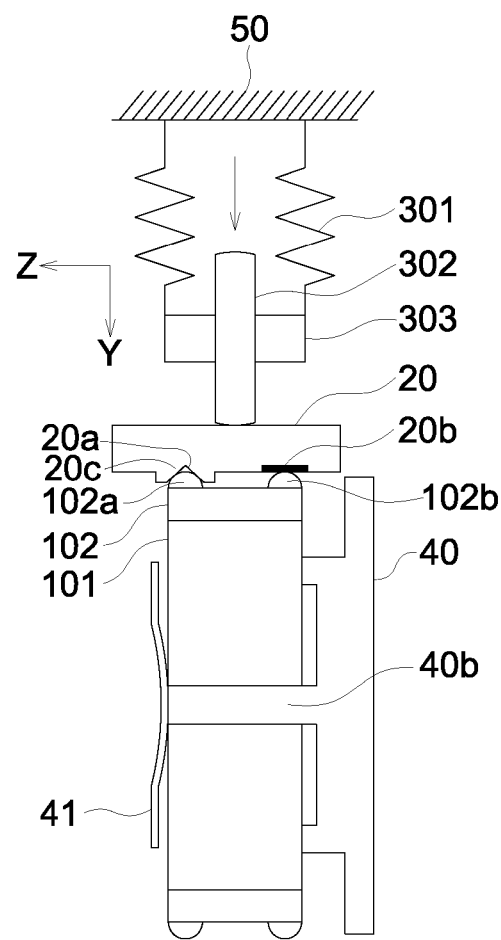

Firstly, the constitution of the friction drive actuator of Embodiment 1 will be described by referring to FIGS. 1a, 1b. FIG. 1a is a front view showing the outline of the entire constitution of a friction drive actuator 1 and FIG. 1b is a side view thereof.

The friction drive actuator 1, as shown in FIG. 1a, includes a vibration member 10, a sliding member 20, and a pressing member 30.

In the friction drive actuator 1, a part of the vibration member 10 is made to move so as to make an elliptical orbit (including a circular orbit), that is, make an elliptical vibration (including a circular vibration) by inputting a drive signal into the vibration member 10 having a piezoelectric displacement element 101, which will be described later, comprised of an electromechanical energy conversion element so as to permit the vibration member 10 to expand and contract. By doing this, the friction drive actuator permits the vibration member 10 and the sliding member 2 in contact therewith in the pressurized state to make a relative movement by frictional force.

The sliding member 20 is permitted to make pressure contact with the vibration member 10 by the pressing member 30 comprised of a coil spring 301, a roller 302, and a roller rotary shaft 303. When the vibration member 10 is driven to make an elliptical vibration, the sliding member 20 is moved by the frictional force. When the rotational direction of the elliptical vibration is clockwise, the sliding member 20 moves to the right, and when it is counterclockwise, the sliding member 20 moves to the left.

The sliding member 20 is an elongated part with an almost rectangular cross section and made of a metal such as stainless steel which is inexpensive and easy to process. The surface thereof, to prevent abrasion with the vibration member 10, is subject to the surface hardening treatment such as tempering or nitriding treatment. Ceramic coating such as CrN or TiCN may be applied. Further, by use of ceramics such as alumina or zirconia, the abrasion resistance can be improved more. Further, to prevent abrasion with the vibration member 10, it is preferable that the surface of the contact portion of the sliding member 20 is smooth.

Figure 2C:
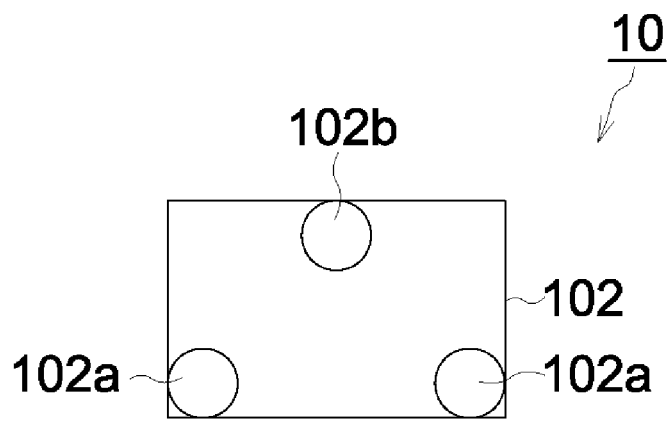
FIGS. 2a, 2b, 2c are external views showing the constitution of a vibration member of Embodiment 1.
Figure 2A:
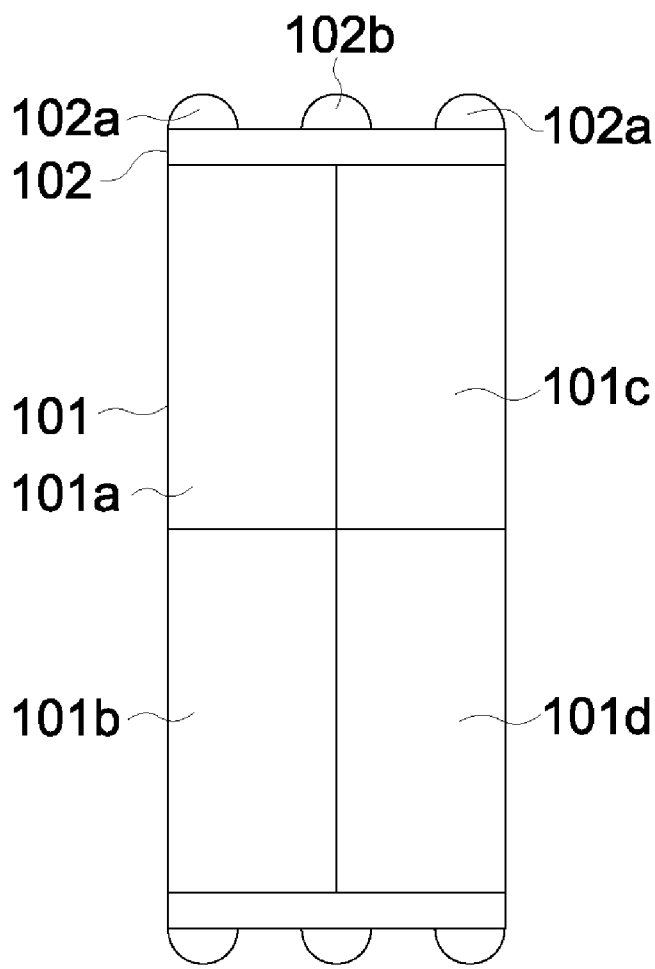
Figure 2B:
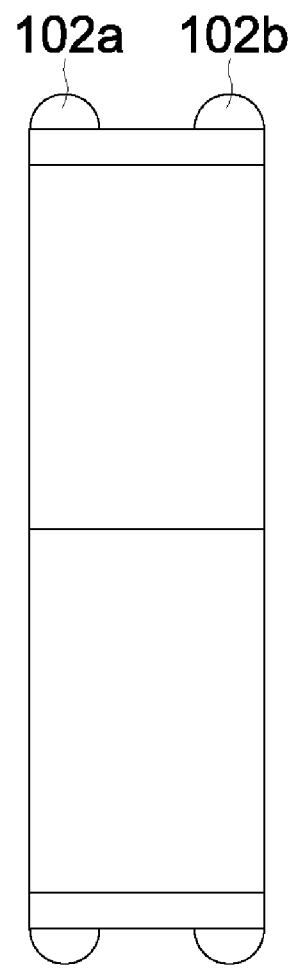

The constitution of the vibration member 10 is shown in FIGS. 2a, 2b, 2c. FIG. 2a is a front view of the vibration member 10, and FIG. 2b is a side view thereof, and FIG. 2c is a plan view thereof.

The vibration member 10, as shown in FIG. 2a, includes the piezoelectric displacement portion 101 and a contact portion 102. The piezoelectric displacement portion 101 has a rectangular shape comprised of the electromechanical energy conversion element such as a piezoelectric element and performs a resonance in the primary longitudinal (expansion and contraction) vibration mode and secondary bending vibration mode which will be described later. The piezoelectric displacement portion 101 is comprised of four displacement portions 101a, 101b, 101c, and 101d, and an inner electrode not shown is divided in a predetermined shape for each displacement portion. A predetermined voltage waveform is impressed to these electrodes, thus to hemispherical projections 102a and 102b formed on the concerned contact portion 102, an elliptical vibration is excited.

Further, the shape of the vibration member 10 and the resonance modes used for driving are not limited to thereto, and an ordinary stationary wave vibration member whose drive force can be taken out from a plurality of places is usable.

Further, as an electromechanical energy conversion element (hereinafter, may be referred to as a displacement element), a laminated piezoelectric element made by alternately laminating a plurality of ceramic thin plates, such as a PZT, showing the piezoelectric characteristic and inner electrodes may be used, or a combination of a single layer of piezoelectric element and a metallic elastic body may be used. In the former case, by adding the displacement of each ceramic thin plate (a piezoelectric element of a single layer), the displacement of whole the displacement element is increased. In the latter case, by resonating the elastic body using the piezoelectric element as a drive source, a large displacement can be obtained.

As a material of the contact portion 102, a preferable material is an ultra hard material which is made of tungsten carbide (WC) as a main material and has a high stable friction coefficient and an excellent abrasion resistance. Further, hard ceramics such as alumina or zirconia may be used, or a ferrous material the surface of which is hardened by the surface treatment such as heat treatment or nitriding treatment may be used.

Figure 3A:
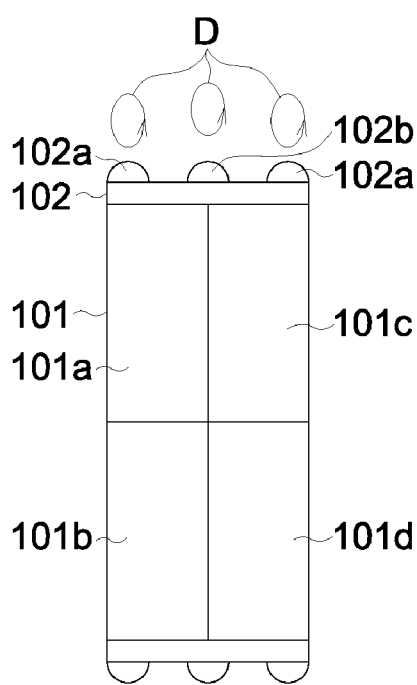
FIGS. 3a, 3b, 3c are drawings showing the situation of a modification of the vibration member in the resonance mode of Embodiment 1.
Figure 3B:
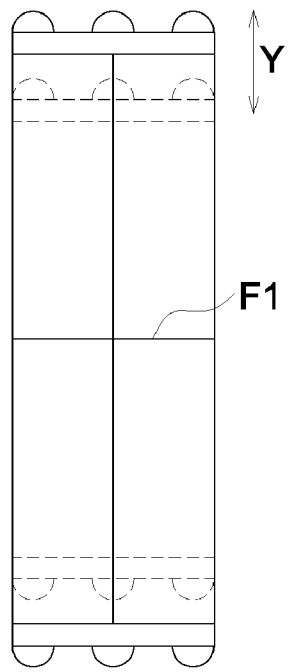
Figure 3C:
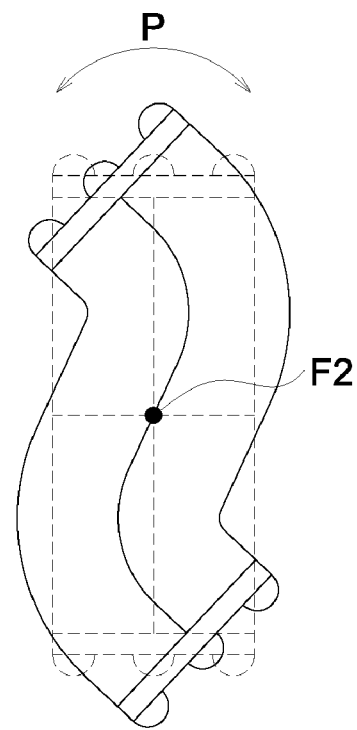

Here, the elliptical vibration excited in the vibration member 10 having such a constitution will be described by referring to FIGS. 3a, 3b, 3c. The vibration member 10 is resonantly driven. FIGS. 3a, 3b, 3c show the appearance of the deformation of the vibration member 10 in the intrinsic mode used for the resonance drive, and FIG. 3a is a drawing showing the appearance of the vibration member 10 when not driven, and FIG. 3b is a drawing showing the appearance of the deformation in the primary longitudinal (expansion and contraction) vibration mode, and FIG. 3c is a drawing showing the appearance of the deformation in the secondary bending vibration mode.

In the primary longitudinal vibration mode, as shown in FIG. 3b, an expansion and contraction vibration is performed with a central part F1 of the vibration member 10 as a node, and the projections 102a and 102b are displaced in the Y direction (longitudinal direction). In the secondary bending vibration mode, as shown in FIG. 3c, a secondary bending modification is performed with F2 as a node, and the ends of the projections 102a and 102b are displaced in the P direction. Further, the appearance of the deformation of the vibration member 10 shown in FIGS. 3b and 3c are exaggeratedly drawn in displacement amount for the purpose of explanation in the respective modes.

The primary longitudinal vibration mode is driven by impressing drive signals in the same phase at their resonance frequencies to the four displacement portions 101a, 101b, 101c, and 101d. The secondary bending vibration mode is drive by impressing a drive signal 1 in the same phase to the displacement portions 101a and 101d and by impressing a drive signal 2 having a predetermined phase difference from the phase of the drive signal 1 to the displacement portions 101b and 101c at their resonance frequencies. The shape of the vibration member 10 is formed so as to set both the resonance frequencies in the primary longitudinal vibration mode and secondary bending vibration mode within a predetermined range, and the vibration member 10 is driven with the two modes almost synchronized with each other, and an elliptical vibration D is thus excited in the projections 102a and 102b, as shown in FIG. 3a. When the projections 102a and 102b are driven so as to make an elliptical orbit, the projections 102a and 102b make contact with the sliding member 20 in a certain range, and the sliding member 20 is driven in a predetermined direction by the frictional force acting between the projections 102a and 102b and the sliding member 20. Further, when the phase shift direction of the drive signals is reversed, the rotational direction of the elliptical orbit of the projections 102a and 102b is reversed, and the moving direction of the sliding member 20 is reversed.

In the friction drive actuator 1 of this embodiment having such a constitution, the change in the relative position between the vibration member 10 and the sliding member 20 is controlled so as to uniquely set the relative position in a direction except a predetermined relative movement direction which is the first direction of the present invention. Hereinafter, the details will be explained.

As shown in FIGS. 1a and 1b, the vibration member 10 is engaged to a shaft 40a provided on a fixing stand 40 corresponding to the base of the present invention through a hole 101h formed in the neighborhood of the node F2 of the secondary bending vibration and is positioned and fixed in the XY plane of the fixing stand 40. The shaft 40a is preferably engaged to the hole 101h by close fit to eliminate backlash. Further, to prevent the vibration member 40 from vibrating laterally (in the X direction) of the fixing stand 40, the vibration member 10 is engaged to a support member 40b provided on the fixing stand 40 for supporting the neighborhood of both ends of the node F1 of the vibration member 10 in the primary longitudinal vibration mode. Further, although there needs to be a gap between the vibration member 10 and fixing stand 40 when they get engaged to each other, they are fixed by an adhesive to eliminate backlash due to the gap. Further, when the adhesion is difficult, the vibration member 10 is pressed by a plate spring 41 against the fixing stand 40 to eliminate backlash also in the Z direction. Further, the fixing of the vibration member 10 is preferably executed in the neighborhood of the node of the vibration as mentioned above so as to prevent the vibration member 10 from disturbing the vibration. Further, power is supplied to the vibration member 10 by using a flexible printed circuit board or a lead wire.

As shown in FIGS. 1a and 1b, the sliding member 20 is an elongated part having an almost rectangular cross section, and a groove portion 20c including a V-shaped elongated groove 20a is formed in the X direction (a predetermined relative movement direction) on the opposite surface to the vibration member 10. The two hemispherical projections 102a, which are provided on the contact portion 102 of the vibration member 10 and correspond to the projections of the present invention, make contact with the V-shaped elongated groove 20a. The angle of the V-shaped portion of the V-shaped elongated groove 20a is preferably 90°, though it is not limited to it and is preferably from 60° to 120° or so. When the angle of the V-shaped portion is excessively small, the engagement of the V-shaped elongated groove 20a to the projections 102a becomes shallow, and the V-shaped elongated groove 20a makes contact with the projections 102a in the neighborhood of the edge thereof, thus the engagement is easy to be disengaged. On the other hand, when the angle of the V-shaped portion is excessively large, the contacts of the side wall of the V-shaped elongated groove 20a with the projections 102a get close each other, and the angle holding the contacts becomes smaller, so that the effect of positioning is lowered.

Further, on the surface of the sliding member 20 where the V-shaped elongated groove 20a is formed, a belt-shaped flat stripe portion such as a flat stripe portion 20b for controlling the swing of the sliding member 20 around the X-axis is provided in a belt shape in parallel to the V-shaped elongated groove 20a. The projection 102b which is provided on the contact portion 102 of the vibration member 10 and corresponds to the projection of the present invention makes contact with the flat stripe portion 20b.

It is preferable that the surfaces of the V-shaped elongated groove 20a and flat stripe portion 20b have smooth surfaces having small surface roughness, and the flatness thereof is highly precise. Further, as the distance between the V-shaped elongated groove 20a and the flat stripe portion 20b becomes longer, the control effect for the swing of the sliding member 20 around the X-axis is increased. Further, the projections 102a and 102b, V-shaped elongated groove 20a, and flat stripe portion 20b correspond to the control member of the present invention.

To keep the sliding member 20 and vibration member 10 in the prescribed contact state, the pressing member 30 permits the sliding member 20 and vibration member 10 to be in pressure contact with each other. The pressing force of the pressing member 30 is transferred by the roller 302, and the coil spring 301 is provided between the roller rotary shaft 303 for bearing the roller 302 and a fixing member 50. The working point of the pressing member 30 to the sliding member 20 is the contact portion between the roller 302 and the sliding member 20, and it is preferable that this contact portion is located almost at the central part of the area, viewed in the Y direction, surrounded by all the contact points between the sliding member 20 and the vibration member 10, that is, the projections 102a and 102b, V-shaped elongated groove 20a, and flat stripe portion 20b. When the working point is outside the concerned area, the posture of the contact portion is easy to change due to a disturbance.

As mentioned above, the relative position between the sliding member 20 and the vibration member 10 is controlled by the four contact points between the V-shaped elongated groove 20a of the sliding member 20 and the two projections 102a of the vibration member 10, so that the changes in the Y direction and Z direction, except the movement in the X direction (the first direction of the invention, or predetermined relative movement direction), are controlled. Further, the pressing force by the pressing member 30 permits the projection 102b of the vibration member 10 and the flat stripe portion 20b of the sliding member 20 to make pressure contact with each other, so that the swing of the sliding member 20 around the X-axis is controlled. As a result, the relative position between the sliding member 20 and the vibration member 10 is set uniquely except the movement in the X direction (the first direction, or predetermined relative movement direction).

As mentioned above, in the friction drive actuator 1 of Embodiment 1 of the present invention, by the pressing member 30 and control member (the two projections 102a and 102b, groove portion 20c, flat stripe portion 20b), the relative position between the vibration member 10 and the sliding member 20 is set uniquely except the predetermined relative movement direction. Since the relative position between the vibration member 10 and the sliding member 20 is set uniquely, the vibration member 10 is positioned, for example, to the cabinet of frame of the apparatus via the fixing stand 40, thus the position of the sliding member 20 is set also at a predetermined position. As a result, a driven member such as the recording/reproducing head to be attached to the sliding member 20 can be positioned with high precision.

Further, there is no backlash at the contact position between the vibration member 10 and the sliding member 20, so that from immediately after start of driving, the sliding member 20 is moved in a desired direction, and a drive mechanism having a rapid start response can be structured. Further, the conventional bearing members are not necessary, and the members concerned in driving are decreased, so that the designs intrinsic to the vibration drive such as keeping the resonance frequencies of these members away from the drive frequency are decreased, thus the apparatus can be designed easily. Further, since the bearing members are not necessary, enlargement and complication of the device are not caused, and the rigidity of the friction drive actuator 1 can be improved. Therefore, the frequency band under the servo control can be shifted toward the high frequency side, and the controllability can be enhanced.

Further, the contact points of by the control member between the vibration member 10 and the sliding member 20 all transfer the drive force, so that even if the friction coefficient at one contact point is changed due to local changes in the surface condition, the friction coefficients including the other contact points are averaged, thus stable driving force can be obtained.

Further, compared with the conventional friction drive actuator, the number of components is decreased, so that the device can be miniaturized.

Modification 1 of Embodiment 1

Figure 4A:
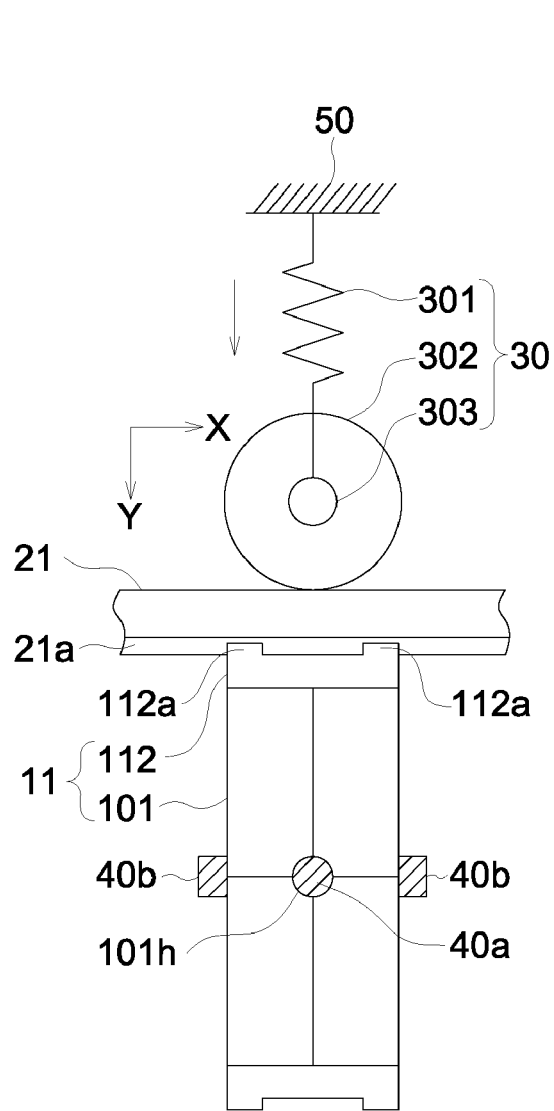
FIGS. 4a, 4b are entire schematic views of a friction drive actuator of Modification 1 of Embodiment 1.
Figure 4B:
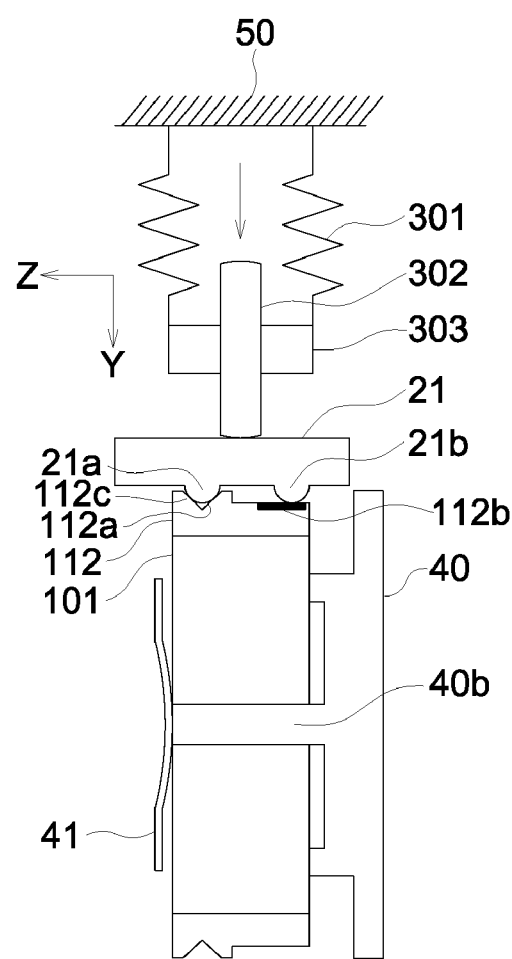

The constitution of the friction drive actuator 1 according to Modification 1 of Embodiment 1 is shown in FIGS. 4a, 4b.

FIG. 4a is a front view showing the outline of the entire constitution of the friction drive actuator 1 and FIG. 4b is a side view thereof.

In the friction drive actuator 1 according to Modification 1, as shown in FIGS. 4a and 4b, two semicylindrical convex rails 21a and 21b corresponding to the convex rails of the present invention are provided in parallel in the X direction (the first direction, or the predetermined relative movement direction) on the surface, of a sliding member 21, opposite to a vibration member 11.

On the other hand, in the vibration member 11, a groove portion 112c having two V-shaped grooves 112a in contact with the convex rail 21a are provided with a predetermined interval in the X direction (the first direction, or the predetermined relative movement direction) Further, a flat stripe portion 112b in contact with the convex rail 21b is provided in a belt shape in parallel with the direction connecting the two V-shaped grooves 112a.

Further, the length of the V-shaped grooves 112a in the X direction (the first direction, or the predetermined relative movement direction) is preferably shorter. When the length is longer, each contact between the V-shaped grooves 112a and the convex rail enter the line contact state, so that the relative movement of the sliding member 21 in the X direction (the first direction, the predetermined relative movement direction) may be affected depending on the processing precision.

The relative position between the sliding member 21 and the vibration member 11 is controlled at the four contact points between the convex rail 21a of the sliding member 21 and the two V-shaped grooves 112a of the vibration member 11, so that the changes in the Y direction and Z direction except the movement in the X direction (the predetermined relative movement direction) are controlled. Further, the pressing force by the pressing member 30 permits the convex rail 21b of the sliding member 21 and the flat stripe portion 112b of the vibration member 11 to make pressure contact with each other, so that the swing of the sliding member 21 around the X-axis is controlled. As a result, the relative position between the sliding member 21 and the vibration member 11 is set uniquely except the movement in the X direction (the first direction, or the predetermined relative movement direction) and the same effect as that of Embodiment 1 can be obtained.

Modification 2 of Embodiment 1

Figure 5A:
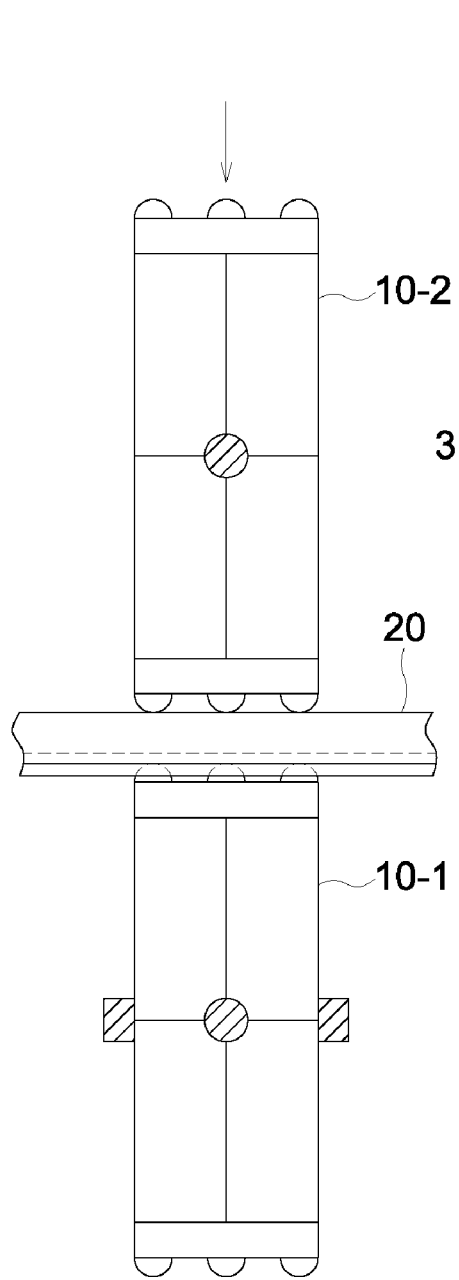
FIGS. 5a, 5b are entire schematic views of a friction drive actuator of Modification 2 of Embodiment 1.
Figure 5B:
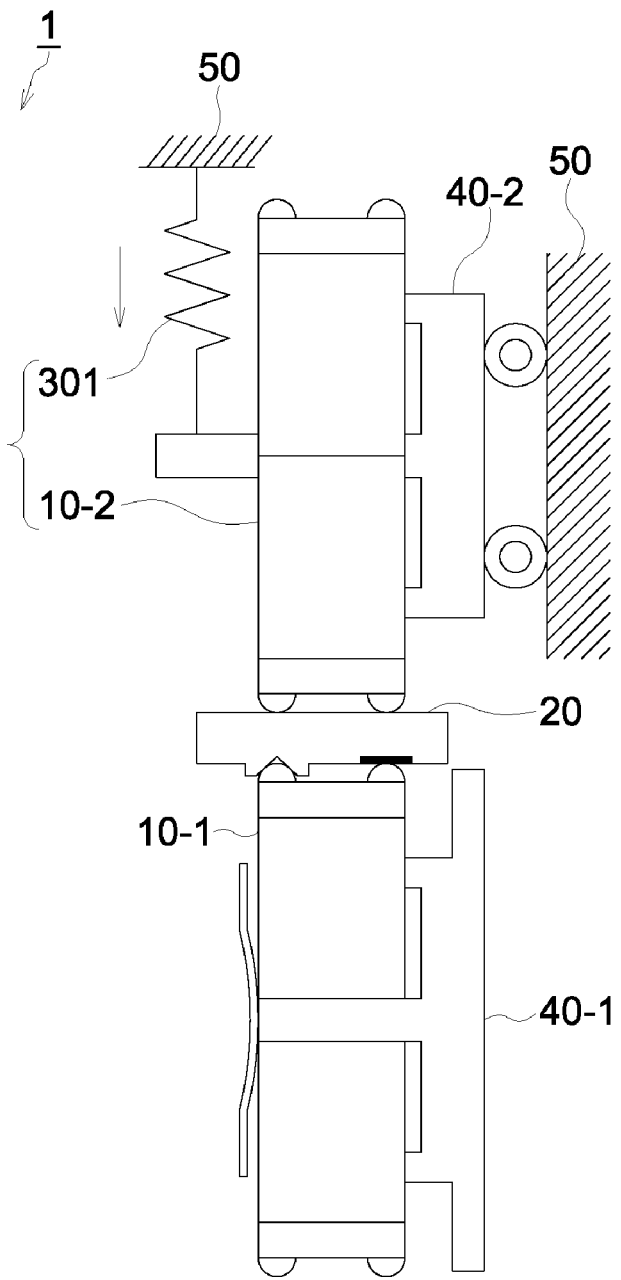

The constitution of the friction drive actuator 1 according to Modification 2 of Embodiment 1 is shown in FIGS. 5a, 5b. FIG. 5a is a front view showing the outline of the entire constitution of the friction drive actuator 1, and FIG. 5b is a side view thereof.

The friction drive actuator 1 according to Modification 2, as shown in FIGS. 5a and 5b, has two vibration members similar to the vibration member 10 of Embodiment 1 which is described by referring to FIGS. 1a, 1b (vibration members 10-1 and 10-2).

One vibration member 10-1 is positioned, similarly to Embodiment 1, for example, on the cabinet or frame of the device via a fixing stand 40-1.

A pressing member 31, in replacement of the roller 302 of Embodiment 1, has the other vibration member 10-2 and permits the sliding member 20 to make pressure contact with the vibration member 10-1 by using the concerned vibration member 10-2.

In the friction drive actuator 1 having such a constitution, the two vibration members (the vibration members 10-1 and 10-2) are caused to perform an elliptical vibration, thus driving force two times that of Embodiment 1 can be obtained. Further, it is a preferable constitution that the fixed vibration member 10-1 controls the relative position to the sliding member 20, and the vibration member 10-2 performs only driving and pressurization but does not control the relative position.

Embodiment 2

Figures 6A, 6B, 6C:
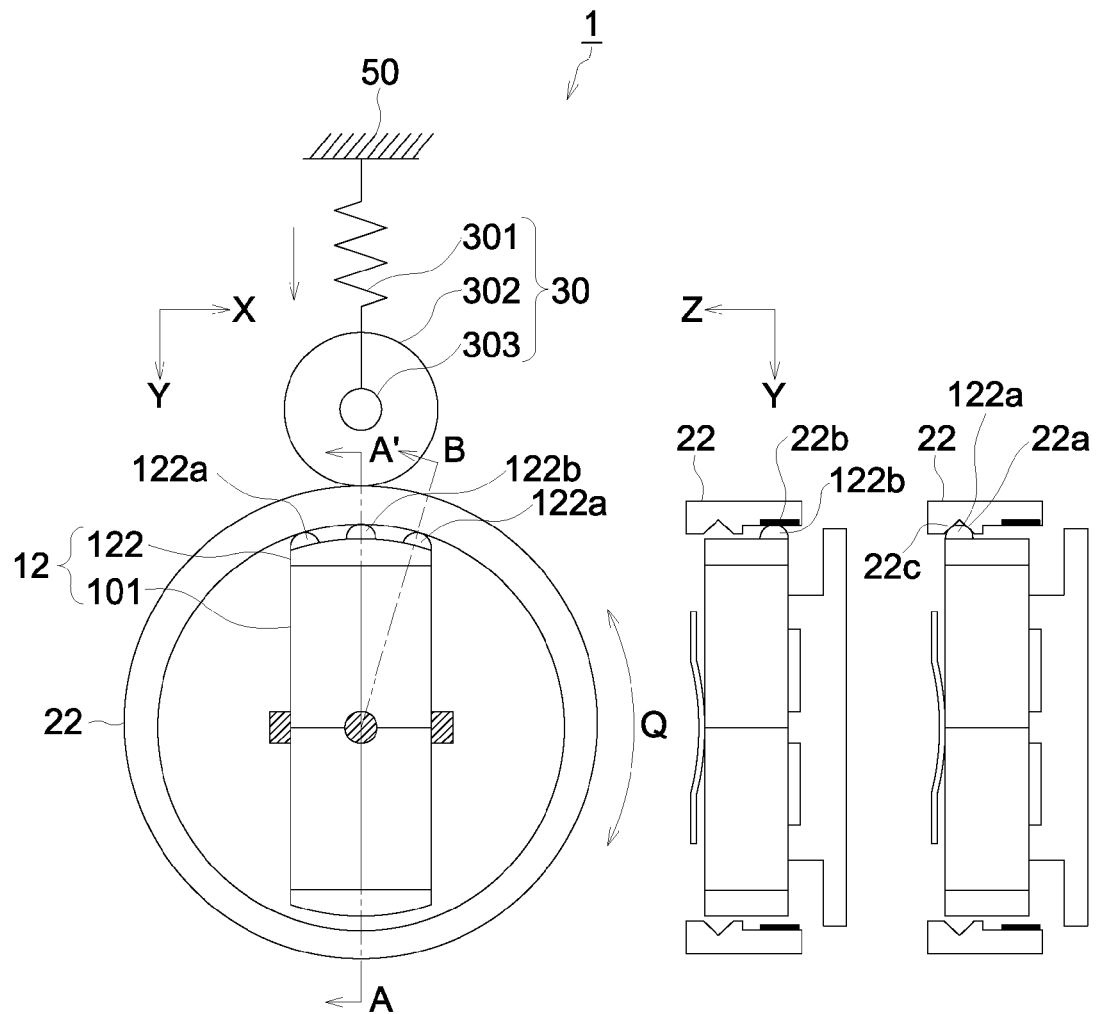
FIGS. 6a, 6b, 6c are entire schematic views of the friction drive actuator of Embodiment 2 of the present invention.

The constitution of the friction drive actuator 1 according to Embodiment 2 will be explained by referring to FIGS. 6a, 6b, 6c. FIG. 6a is a front view showing the outline of the entire constitution of the friction drive actuator 1, and FIG. 6b is a cross sectional view along the line A-A' shown in FIG. 6a, and FIG. 6c is a cross sectional view along the line A-B shown in FIG. 6a.

The friction drive actuator 1, as shown in FIG. 6a, includes a vibration member 12, a sliding member 22, and the pressing member 30.

In the friction drive actuator 1 according to Embodiment 1, the vibration member 10 and sliding member 20 make a straight relative movement, while in Embodiment 2, the circular ring-shaped sliding member 22 and the vibration member 12 arranged therein make a relative rotation.

The sliding member 22, as shown in FIG. 6a, is formed in a circular ring shape, and as shown in FIGS. 6b and 6c, a groove portion 22c having a V-shaped elongated groove 22a is formed in a ring shape in a swing direction Q (a first direction of the present invention, or a predetermined relative movement direction) on the surface thereof facing the vibration member 12. Further, on the surface where the V-shaped elongated groove 22a of the sliding member 22 is formed, a flat stripe portion 22b for controlling the swing of the sliding member 22 around the X-axis is provided in a belt shape in parallel with the V-shaped elongated groove 22a.

Figure 7C:
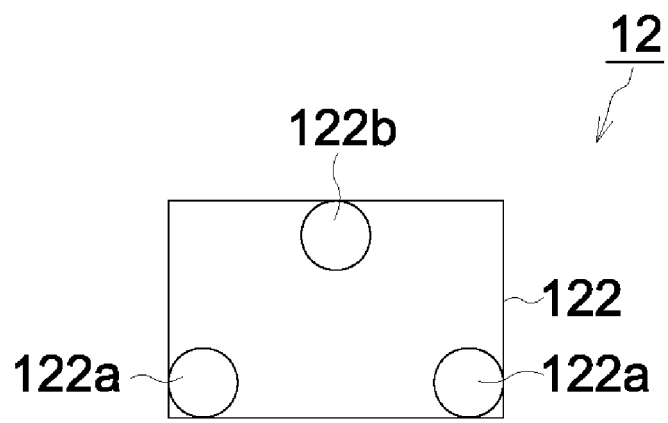
FIGS. 7a, 7b, 7c are external views showing the constitution of the vibration member of Embodiment 2.
Figure 7A:
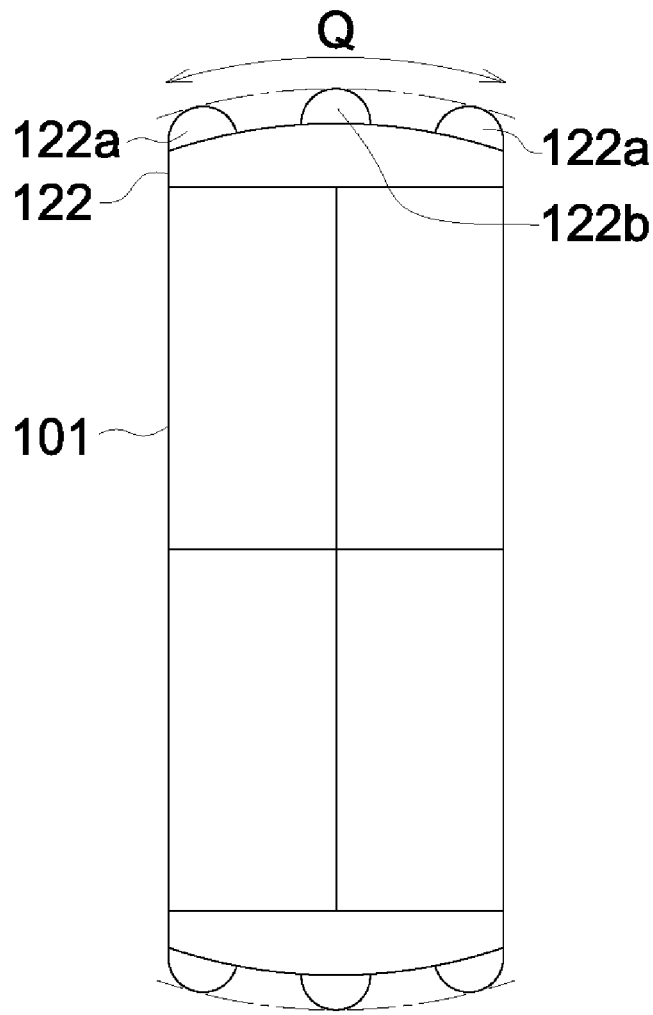
Figure 7B:
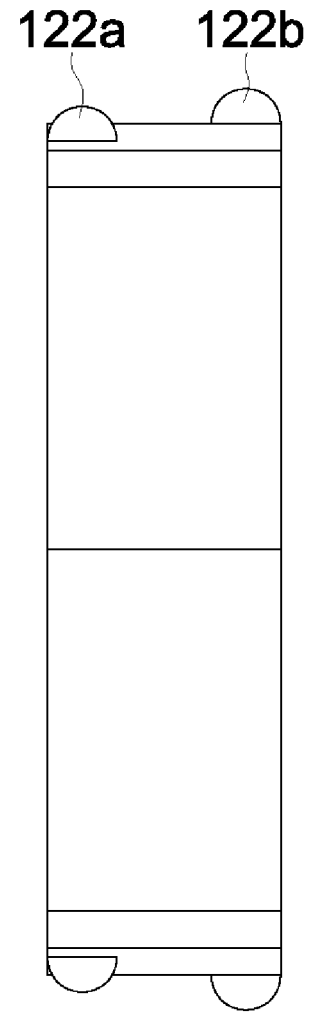

On the other hand, the surface of the vibration member 12 facing the sliding member 22, as shown in FIGS. 7a, 7b, 7c, is formed in a circular arc shape along the inner peripheral surface of the sliding member 22. On the vibration member 12, two hemispherical projections 122a in contact with the V-shaped elongated groove 22a are provided with a predetermined interval in the swing direction Q (the predetermined relative movement direction) Further, a projection 122b is provided in contact with the flat stripe portion 20b. Further, it should be noted that FIG. 7a is a front view of the vibration member 12, and FIG. 7b is a side view thereof, and FIG. 7c is a plan view thereof.

The relative position between the sliding member 22 and the vibration member 12 is controlled by the four contact points between the V-shaped elongated groove 22a of the sliding member 22 and the two projections 122a of the vibration member 12, so that the changes in the Y direction and Z direction are controlled except the movement in the rotating direction Q (the first direction, or the predetermined relative movement direction). Further, the pressing force by the pressing member 30 causes the projection 122b of the vibration member 12 and the flat stripe portion 22b of the sliding member 22 to make pressure contact with each other, so that the rotation of the sliding member 22 around the X-axis is controlled. As a result, the relative position between the sliding member 22 and the vibration member 12 is set uniquely except the movement in the rotating direction Q (the first direction, or the predetermined relative movement direction) and the same effect as that of Embodiment 1 can be obtained.

Modification 1 of Embodiment 2

Figures 8A, 8B:
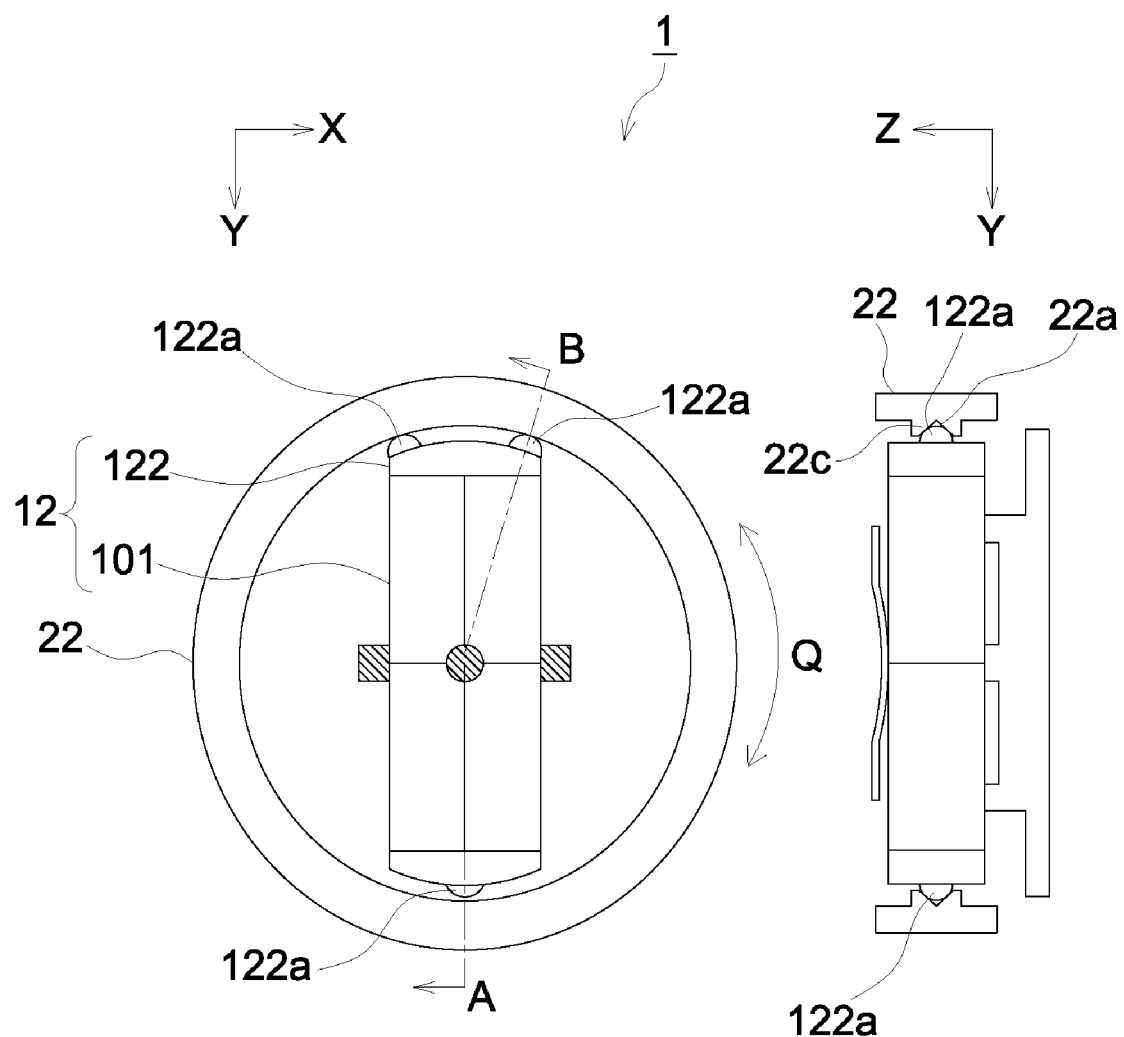
FIGS. 8a, 8b are entire schematic views of a friction drive actuator of Modification 1 of Embodiment 2.

The constitution of the friction drive actuator 1 according to Modification 1 of Embodiment 2 is shown in FIGS. 8a, 8b.

FIG. 8a is a front view showing the outline of the entire constitution of the friction drive actuator 1, and FIG. 8b is a cross sectional view along the line A-B shown in FIG. 8a.

The friction drive actuator 1 according to Modification 1, as shown in FIG. 8a, includes a vibration member 12 and sliding member 22, and similarly to Embodiment 2, the circular ring-shaped sliding member 22 rotates relative to the vibration member 12 arranged therein.

In the friction drive actuator 1 according to Modification 1, the sliding member 22 itself has a pressing function instead of having a pressing member 30 comprised of a coil spring 301, roller 302, and roller rotary shaft 303 which are equipped in Embodiment 2.

In the sliding member 22, before assembly with the vibration member 12, the diameter (inside diameter) thereof is set smaller than the length of the vibration member 12, and when it is assembled with the vibration member 12, the sliding member 22 is deformed by the vibration member 12 so that the diameter thereof is increased (in an elliptical shape), and on each contact portion between the vibration member 12 and the sliding member 22, the restoring force due to the elastic deformation of the sliding member 22 acts as pressing force. By the pressing force, the movement in the radial direction of the sliding member 22 with respect to the vibration member 12 is controlled without any backlash.

Further, the contact between the sliding member 22 and the vibration member 12 is limited at three portions, instead of all the circumferential area, so as to provide non-contact portions free of restriction by the vibration member 12. Compared with the case that all the circumferential area is in contact with the vibration member 12, the elastic deformation of the sliding member 22 is easy, so that the sliding member 22 is charged by the contact portions and the spring constant, when assuming the pressing force as one caused by the spring, is made smaller, compared with the case that all the circumferential area is in contact. In this arrangement, even if there are manufacturing errors in the dimensions of the vibration member 12 or sliding member 22, changes in the pressing force with respect to the error amounts is limited small. Further, due to temperature changes, even if dimensional changes are caused in the vibration member 12 and sliding member 22, changes in the pressing force is limited small, since the spring constant is small, thus the pressing force is stabilized. This arrangement reduces the error sensitivity of the pressing force with respect to the change of dimension, consequently, the drive performance is stabilized.

Further, the pressing force is generated by the elastic deformation of the sliding member 22 itself, so that an external pressing mechanism is not necessary, and it can contribute to simplification and miniaturization of the mechanism. Further, the adjustment step for the pressing force is not necessary, thus the productivity is improved.

As shown in FIG. 8a, the sliding member 22 is formed in a circular ring shape, and on the surface thereof opposite to the vibration member 12, the V-shaped elongated groove 22a is formed in a ring shape in the swing direction Q (the first direction, or the predetermined relative movement direction) as shown in FIG. 8b.

Figure 9C:
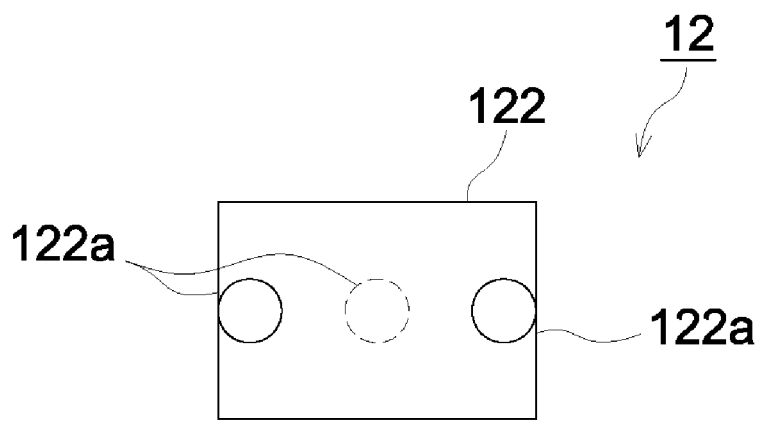
FIGS. 9a, 9b, 9c are external views showing the constitution of the vibration member of Modification 1 of Embodiment 2.
Figures 9A, 9B:
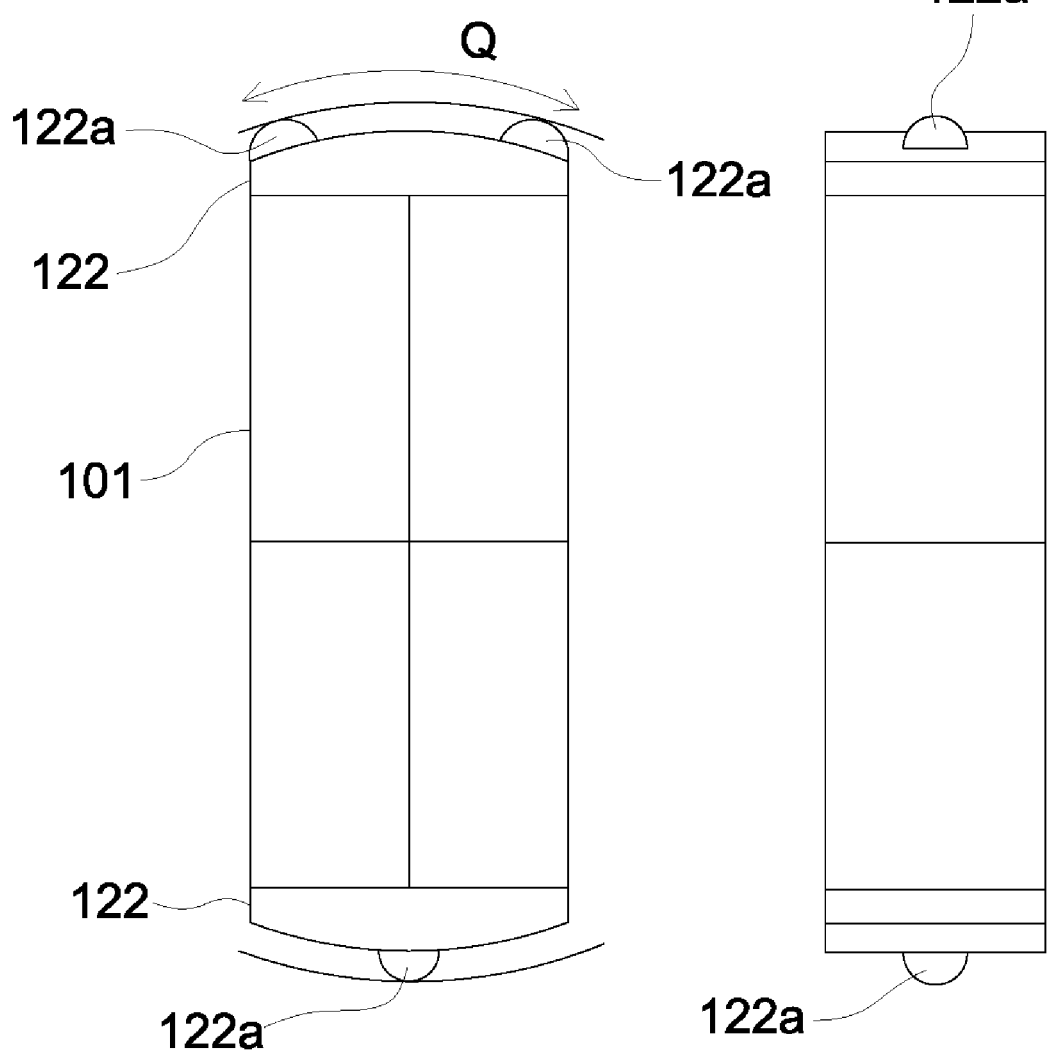
Figures 10A, 10B:
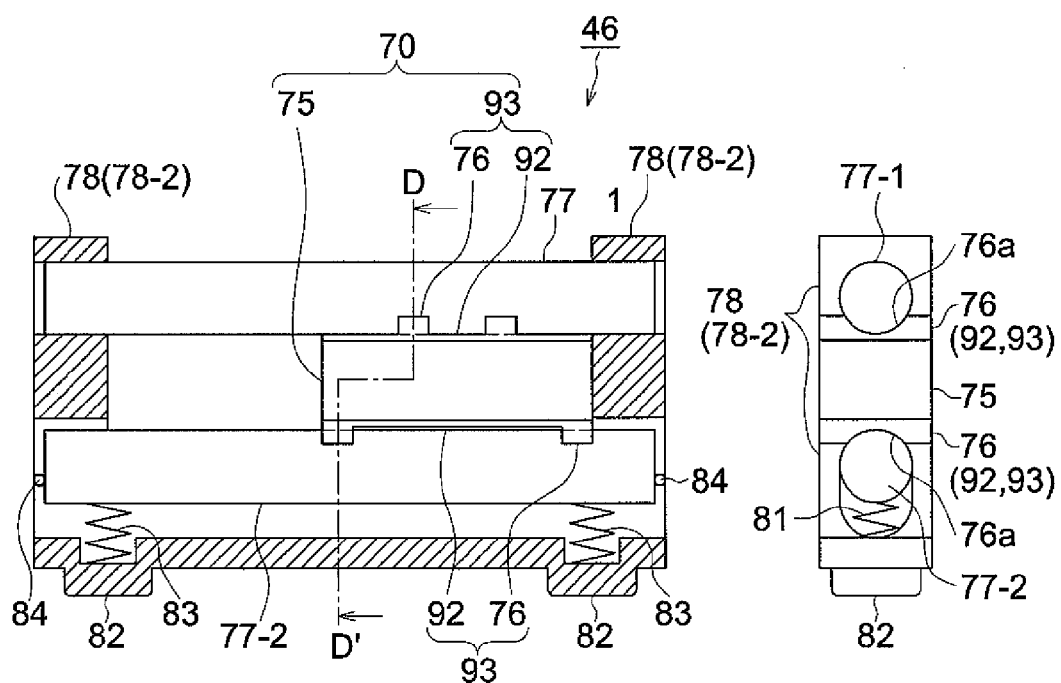
FIGS. 10a, 10b are entire schematic views of a conventional friction drive actuator.

On the other hand, the end face of the vibration member 12 opposite to the sliding member 22 is formed in a circular arc shape along the inner peripheral surface of the sliding member 22 as shown in FIG. 9a. On the side of one of the short sides of the vibration member 12, the two hemispherical projections 122a are installed in contact with the V-shaped elongated groove 22a with a predetermined interval in the swing direction Q (the first direction, or the predetermined relative movement direction). Further, at the center of the other end face, one hemispherical projection 122a is installed in contact with the V-shaped elongated groove 22a. Further, FIG. 9a is a front view of the vibration member 12, and FIG. 9b is a side view thereof, and FIG. 9c is a plan view thereof.

The relative position between the sliding member 22 and the vibration member 12 is controlled at the six contact points between the V-shaped elongated groove 22a provided in a groove portion 22c of the sliding member 22 and the three projections 122a of the vibration member 12, so that the relative position is uniquely set, except the movement in the swing direction Q (the predetermined relative movement direction), and the same effect as that of Embodiment 1 can be obtained.

Further, in this embodiment, the V-shaped elongated groove 22a is installed in the sliding member 22, and the three hemispherical projections 122a are installed on the vibration member 12 in contact with the V-shaped elongated groove 22a, though they may be configured such that three V-shaped grooves are provided on the vibration member 12 and semicircular semicylindrical convex rails are installed on the sliding member 22 in contact with the three V-shaped grooves.

Further, the shape of the vibration member 12 is not limited to the rectangle, and it may be configured triangular so as to be in pressure contact with the sliding member 22 at the three apexes of the triangle. Also in this case, the same effect as that of Embodiment 1 can be obtained.

According to the embodiments of the present invention, the constitution is made such that there is provided a control member at each of a plurality of contact portions between the vibration member and the sliding member for controlling the relative movement between the vibration member and the sliding member in the direction perpendicular to a desired movement direction when the vibration member and sliding member are in pressure contact with each other by the pressing member. Namely, by the pressing member and the control member, the relative position between the vibration member and the sliding member is uniquely set except in the desired movement direction. Since the relative position between the vibration member and the sliding member can be uniquely set, the position of the sliding member is set at the predetermined position by positioning the vibration member on, for example, the cabinet or frame of the apparatus. As a result, a driven member to be attached to the sliding member such as the recording/reproducing head can be positioned with high precision.

Further, in the case of a circular ring shaped sliding member, the constitution is made such that there is provided a control member on each of a plurality of contact portions between the vibration member and the sliding member for controlling the relative movement between the vibration member and the sliding member in the direction perpendicular to a desired movement direction in the state that the circular ring-shaped sliding member is deformed elastically and the inner peripheral surface thereof is in pressure contact with the vibration member. Namely, the sliding member makes pressure contact with the vibration member due to the restoring force of the sliding member which is formed in a circular ring shape and is deformed in the radial direction. The pressing force is generated from the elastic deformation of the sliding member itself, so that an external pressing mechanism is not necessary and it can contribute to simplification and miniaturization of the mechanism. Further, the adjustment step for the pressing force is not necessary, thus the productivity can be improved.

What is claimed is:

1. A friction drive actuator for driving a sliding member in a predetermined direction, comprising:

at least one vibration member which is configured to be driven to vibrate by expansion and contraction of a piezoelectric displacement portion which is included in the vibration member and driven by a driving signal;

a pressing member which causes the vibration member and the sliding member to come into a pressure contact therebetween; and a control member which is provided on each of the vibration member and the sliding member at a contact portion therebetween and which is configured to set the sliding member in a unique position with respect to the vibration member in a direction other than the predetermined direction when the vibration member and the sliding member are pressedly contacted with each other by the pressing member, wherein the sliding member is in contact with the vibration member and is driven by the vibration member in the predetermined direction with respect to the vibration member, wherein the control member disposed on the sliding member includes:

a groove portion having a v-shaped elongated groove which is formed along the predetermined direction and has a V-shaped cross section perpendicular to the predetermined direction; and a flat strip portion provided parallel to the v-shaped elongated groove, wherein the control member disposed on the vibration member includes:

two first projections which are provided in the predetermined direction with an interval therebetween and are in contact with inner walls of the v-shaped elongated groove; and a second projection which is provided between the first projections and is in contact with the flat strip portion.

2. The friction drive actuator of claim 1, wherein the first projections have a hemispherical shape.

3. The friction drive actuator of claim 1, wherein the sliding member is formed to be elongated and moves linearly with respect to the vibration member.

4. The friction drive actuator of claim 1, wherein the sliding member is formed to be circular and rotates with respect to the vibration member.

5. The friction drive actuator of claim 1, comprising:

two of the vibration members, wherein the pressing member makes, using one of the two vibration members, the other vibration member and the sliding member in pressure contact with each other.

6. A friction drive actuator, comprising:

a vibration member which is configured to be driven to vibrate by expansion and contraction of a piezoelectric displacement portion which is included in the vibration member and driven by a driving signal;

a sliding member which is in contact with the vibration member and is driven by the vibration member in a first direction with respect to the vibration member;

a pressing member which causes the vibration member and the sliding member to come into a pressure contact therebetween; and a control member which is provided on each of the vibration member and the sliding member at a contact portion therebetween for controlling a relative movement of the sliding member with respect to the vibration member in a direction perpendicular to the first direction and parallel to a surface of the sliding member when the vibration member and the sliding member are pressedly contacted with each other by the pressing member, wherein the control member disposed on the sliding member includes:

a groove portion having a v-shaped elongated groove which is formed along the first direction and has a V-shaped cross section perpendicular to the first direction; and a flat strip portion provided parallel to the v-shaped elongated groove, wherein the control member disposed on the vibration member includes:

two first projections which are provided in the first direction with an interval therebetween and are in contact with inner walls of the v-shaped elongated groove; and a second projection which is provided between the first projections and is in contact with the flat strip portion.

7. The friction drive actuator of claim 6, wherein the first projections have a hemispherical shape.

8. The friction drive actuator of claim 6, wherein the sliding member is formed to be elongated and moves linearly with respect to the vibration member.

9. The friction drive actuator of claim 6, wherein the vibration member is driven by expansion and contraction of the piezoelectric displacement element to cause a longitudinal vibration and a bending vibration, and is secured to a base at a node of one or both of the longitudinal vibration and the bending vibration.

* * * * *